(12) United States Patent
Lelong et al.

(10) Patent No.: US 10,097,194 B2
(45) Date of Patent: Oct. 9, 2018

(54) METHOD OF SYNTHESIS OF AN ANALOGUE NOISE, NOISE SYNTHESIZER AND CODING CHAIN USING SUCH A SYNTHESISER

(71) Applicant: THALES, Courbevoie (FR)

(72) Inventors: Bruno Lelong, Elancourt (FR); Patrice Barret, Pessac (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/574,128

(22) PCT Filed: May 27, 2016

(86) PCT No.: PCT/EP2016/062072
§ 371 (c)(1),
(2) Date: Nov. 14, 2017

(87) PCT Pub. No.: WO2016/198269
PCT Pub. Date: Dec. 15, 2016

(65) Prior Publication Data
US 2018/0152195 A1 May 31, 2018

(30) Foreign Application Priority Data
Jun. 10, 2015 (FR) .................................. 15 01203

(51) Int. Cl.
| | |
|---|---|
| *H03M 1/06* | (2006.01) |
| *G01S 7/285* | (2006.01) |
| *G01S 7/35* | (2006.01) |
| *H03M 1/12* | (2006.01) |

(52) U.S. Cl.
CPC .......... *H03M 1/0626* (2013.01); *G01S 7/285* (2013.01); *G01S 7/352* (2013.01); *H03M 1/0614* (2013.01); *H03M 1/12* (2013.01)

(58) Field of Classification Search
CPC ....... H03M 1/0626; G01S 7/285; G01S 7/352
USPC ................................................ 341/118–155
See application file for complete search history.

(56) References Cited

U.S. PATENT DOCUMENTS

| | | | |
|---|---|---|---|
| 5,675,335 A | 10/1997 | Keller | |
| 6,268,814 B1 | 7/2001 | Kolsrud | |
| 6,449,596 B1 * | 9/2002 | Ejima | G11B 20/00007 704/501 |

(Continued)

OTHER PUBLICATIONS

Chen et al., "A low power programmable PRBS generator and a clock multiplier unit for 10 Gbps serdes applications," 2006 IEEE International Symposium on Circuits and Systems, May 21, 2006, pp. 3273-3276, XP032458447.

(Continued)

*Primary Examiner* — Lam T Mai
(74) *Attorney, Agent, or Firm* — Baker & Hostetler LLP

(57) ABSTRACT

A method comprises at least the following steps: generating pseudo random noise in the digital domain coded on a number N of bits, sampled at a given frequency FH/N; multiplexing in the digital domain the binary signals produced by each of the N bits at a sampling frequency FH so as to obtain noise coded on one bit at said frequency FH; transferring the noise thus coded into the analog domain via a low-voltage differential transmission interface; filtering the analog signal in a passband which can be centered on half the sampling frequency of an analog-digital converter.

16 Claims, 2 Drawing Sheets

(56) References Cited

U.S. PATENT DOCUMENTS

2004/0208634 A1* 10/2004 Nishimura ........... H04B 10/532
398/183
2010/0079174 A1* 4/2010 Tsai .................... H03K 23/667
327/105

OTHER PUBLICATIONS

S. Bommalingaiahnapallya et al., "High-Speed Circuits for a Multi-Lane 12 Gbps CMOS PRBS Generator," IEEE International Symposium on Circuits and Systems, May 1, 2007, pp. 3896-3899, XP031182159.
A. Gharib et al., "A 1.16 pJ/bit 80 Gb/s 211-1 PRBS generator in SiGe bipolar techno," 2014 9th European Microwave Integrated Circuit Conference, Oct. 6, 2014, pp. 277-280, XP032712630.
T. Dickson et al., "An 80-Gb/s 2/sup 31/-1 pseudorandom binary sequence generator in SiGe BiCMOS technology," IEEE Journal of Solid-State Circuits, vol. 40, No. 12, Dec. 1, 2005, pp. 2735-2745, XP055267655.

\* cited by examiner

METHOD OF SYNTHESIS OF AN ANALOGUE NOISE, NOISE SYNTHESIZER AND CODING CHAIN USING SUCH A SYNTHESISER

CROSS-REFERENCE TO RELATED APPLICATIONS

This application is a National Stage of International patent application PCT/EP2016/062072, filed on May 27, 2016, which claims priority to foreign French patent application No. FR 1501203, filed on Jun. 10, 2015, the disclosures of which are incorporated by reference in their entirety.

FIELD OF THE INVENTION

The present invention relates to a method of synthesizing analog noise. It also relates to a shaped-noise synthesizer with high output level, implementing this method. It relates finally to a coding chain with very high linearity and very large dynamic range using such a synthesizer. It applies in particular when correcting non-linearity defects present in analog-digital conversion chains.

BACKGROUND

In the field of analog-digital converters (ADC), it is necessary to limit the non-linearity defects of these converters. These defects in fact generate a degradation in the performance of the signal before sampling, the effect of this being to introduce harmonic distortion.

For radar applications in particular, this degradation greatly limits the sensitivity of the radar whose detection threshold must then be raised so as not to generate false detections on the harmonic ranks of the main signal.

To limit this phenomenon, a suitable solution consists in coupling noise with the signal, thus making it possible statistically to limit the periodic passage over the points of non-linearity. However, for this to be effective, the power of this noise must necessarily be fairly significant in order to address the whole set of codes of the converter, but it is also essential that this noise be able to be eliminated after digital acquisition.

Within the framework of a radar application, the useful band of the signal to be processed being known, the choice is to inject noise power into a band not covering the useful band of the signal so as to eliminate the noise easily by high-pass or low-pass filtering as a function of the frequency positioning of the noise.

The generation of this noise and more particularly the implementation of this synthesis can pose a problem of bulkiness, in particular in compact applications. Indeed, for compact applications it is essential to limit the surface area of this functionality whilst the useful bands to be processed are significant, the frequencies involved being very high.

A technical problem to be solved is therefore to carry out the synthesis of analog noise in a high but limited frequency band, for example around 350 MHz to +/−30 MHz, with a relatively high overall power, doing so in a reduced volume.

Solutions for generating analog noise are known. In a first solution, the noise generation is performed by means of an amplified noise diode. This principle necessitates a relatively significant volume and introduces high constraints. Indeed, the noise power is extended over a very wide frequency domain and requires significant filtering in order to preserve only the desired band. Moreover, the noise power is very low after filtering, thus requiring several amplification stages with risks of instability related to the large gain of the chain.

In another solution, the noise is generated on the basis of a digital-analog converter (DAC). The principle is then to synthesize in the digital domain the noise and to convert it into analog via a DAC. With this principle, it is possible to limit the noise band generated but as with any sampled system, it is necessary to filter in analog in order to limit all the image bands. A significant drawback of this solution in regard to the application envisaged is that the frequencies implemented require the use of a DAC with very high sampling frequency, thus necessitating the generation of an additional external clock and extra consumed power, and furthermore not allowing the analog amplification stage to be dispensed with.

SUMMARY OF THE INVENTION

An aim of the invention is in particular to alleviate the aforementioned drawbacks, by allowing the generation of noise centered around an intermediate frequency or RF frequency with a frequency band sufficient to effectively linearize the coders and to do so with very few components.

For this purpose the subject of the invention is a method of synthesizing analog noise, said method comprising at least the following steps:
  Generating pseudo random noise in the digital domain coded on a number N of bits, sampled at a given frequency FH/N;
  Multiplexing in the digital domain the binary signals produced by each of the N bits at a sampling frequency FH so as to obtain noise coded on one bit at said frequency FH;
  Transferring the noise thus coded into the analog domain via a differential transmission interface.

In a particular embodiment, the step of transferring into the analog domain is followed by a step of analog filtering by a bandpass filter.

Said analog noise being able to be combined with a useful signal at the input of an analog-digital converter, the passband of said analog filter is for example centered on half the sampling frequency of said converter, said passband not overlapping the frequency band of said useful signal. The filtering step can be followed by a step of amplifying the noise.

Said analog noise being able to be combined with a useful signal at the input of an analog-digital converter, the noise coded on one bit on output from the multiplexing step is for example centered on a central frequency Fc equal to half the sampling frequency of said converter.

The number N being for example equal to 4, said pseudo random noise is sampled at a frequency equal to $\frac{2}{3}$ of said central frequency Fc.

The subject of the invention is also an analog noise synthesizer comprising at least the following modules:
  A module for generating pseudo random noise in the digital domain coded on a number N of bits, sampled at a given frequency FH/N;
  A multiplexer carrying out in the digital domain the multiplexing of the binary signals produced by each of the N bits at a sampling frequency FH so as to obtain noise coded on one bit at said frequency FH;
  A differential transmission interface for transferring the noise thus coded into the analog domain.

The differential transmission interface is for example of the LVDS type.

Said synthesizer comprises for example a bandpass analog filter at the output of the differential transmission interface. Said analog noise being able to be combined with a useful signal at the input of an analog-digital converter the passband of said filter is for example centered on half the sampling frequency of said converter, said passband not overlapping the frequency band of said useful signal.

Said analog noise being able to be combined with a useful signal at the input of an analog-digital converter, the noise coded on one bit on output from the multiplexer is for example centered on a central frequency Fc equal to half the sampling frequency of said converter.

In a particular embodiment, the number N being equal to 4, said pseudo random noise is sampled at a frequency equal to ⅔ of said central frequency Fc.

Advantageously, the pseudo random noise generation module and the multiplexer are for example embodied in an FPGA, the differential transmission interface being a differential output of said FPGA.

The invention also relates to an analog-digital coding chain, said chain being able to code a useful signal. It comprises at least:
- a digital-analog converter;
- a synthesizer such as described above;
- a combiner combining said useful signal and the noise generated by said synthesizer;
- the output of said combiner being linked to the input of said converter, so that the combined signal is digitally converted.

The digitized noise is for example filtered on output from the converter by a digital filter.

Said coding chain is in particular able to be used in a radar reception chain, said useful signal being a radar reception signal.

BRIEF DESCRIPTION OF THE DRAWINGS

Other characteristics and advantages of the invention will become apparent with the aid of the description which follows, given in relation to appended drawings which represent.

DETAILED DESCRIPTION

Figure 1:
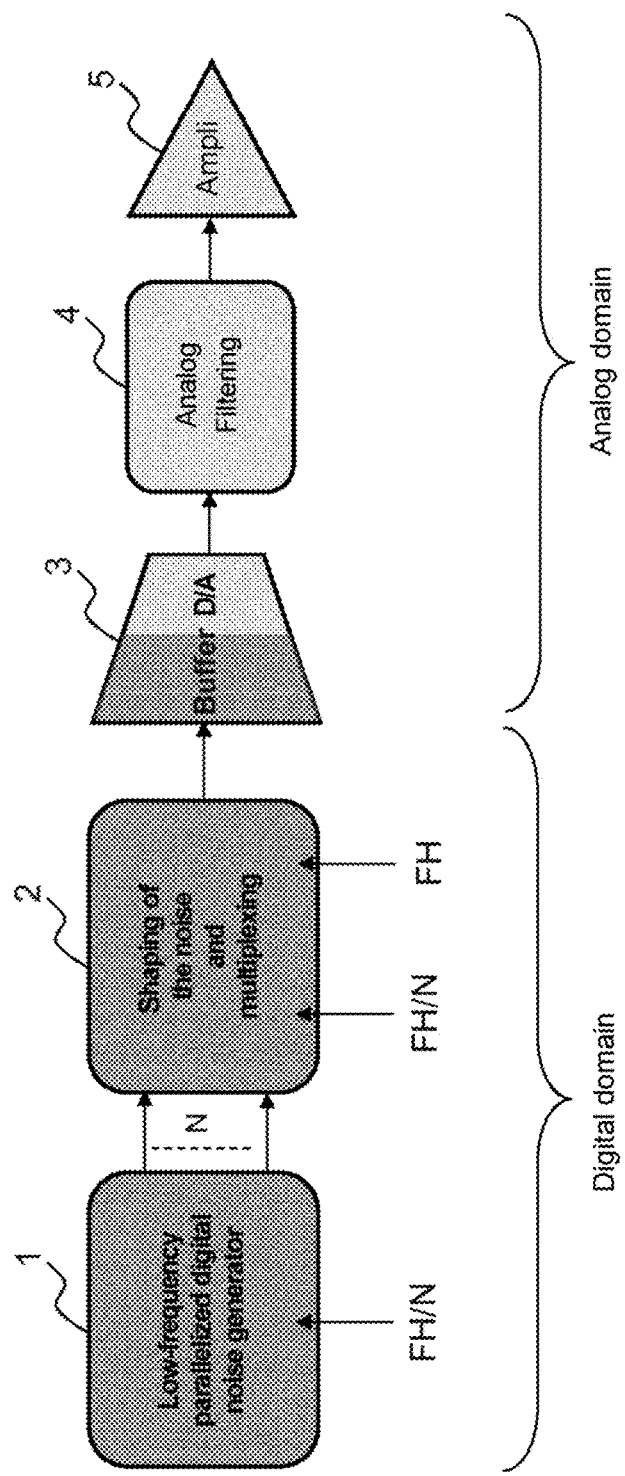
FIG. 1, a representation of an exemplary functional architecture of a noise synthesizer implementing the method according to the invention.

FIG. 1 illustrates the functional architecture of a noise synthesizer implementing the method according to the invention.

In the method according to the invention, the noise is synthesized on one bit shaped in mixed, digital and analog, technology, around a high frequency. One begins by generating, in the digital domain, the shaped noise signal on one bit and it is then transferred into the analog domain via a differential interface, and thereafter it is optimized in the desired frequency band via a filtering stage.

The functional architecture of FIG. 1 exhibits the operating principle thus described in its broad outline.

The generation of the noise 1 is therefore firstly carried out in the digital domain, for example in an FPGA, on the principle of a digital synthesis advantageously coded on one bit, the noise arising as a succession of binary values sampled at a clock frequency FH.

More particularly, in a first step the noise generation 1 is carried out by parallelizing N low-frequency pathways, each pathway generating noise regulated at the frequency FH/N. This amounts to generating a random sequence on 1 bit on the basis of N undersampled 1-bit pathways.

In a second step, the noise is shaped by digital multiplexing 2 of the N pathways giving a noise signal coded on one bit, sampled at the clock frequency FH. In practice, N is for example equal to 4. Shaped noise should be understood to mean noise which is not white noise but noise having a given, in particular a narrow, passband. The central frequency of the noise is for example equal to $F_{smp}/2$, $F_{smp}$ being the sampling frequency of the coder to be linearized.

This one-bit synthesized signal is transmitted onto a buffer 3, this buffer being a low-voltage differential transmission interface, also termed LVDS (Low Voltage Differential Signal), which is particularly well suited to very high frequencies, typically several hundreds of megahertz. This interface advantageously makes it possible to pass from the digital domain to the analog domain without using a digital-analog converter.

This interface can be advantageously a differential output of the FPGA in which the digital synthesis is already programmed, thus dispensing with the need to use an additional component.

In a following step, the analog signal output by the buffer 3 is thereafter filtered 4 by a bandpass filter, the passband of this filter being outside the band of the useful signal with which the noise is intended to be combined. On output from the filtering 4, the noise can be amplified 5 if necessary.

Figure 2:
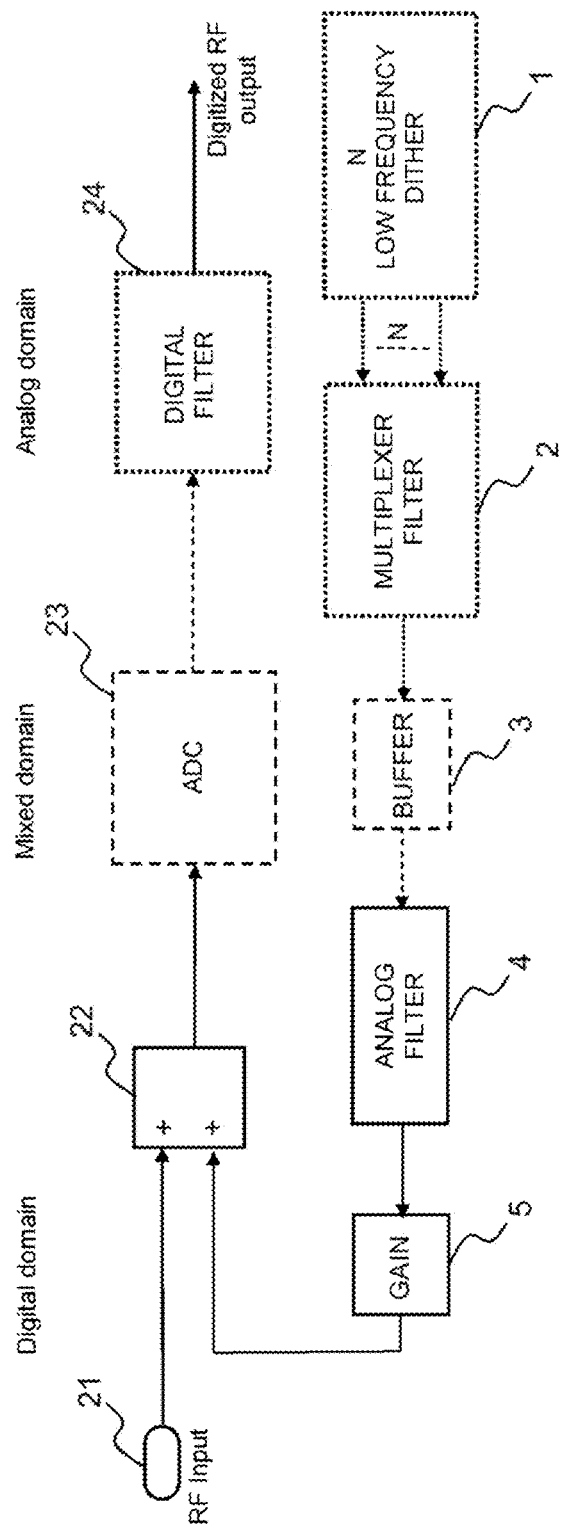
FIG. 2, an exemplary embodiment of a coding chain according to the invention.

FIG. 2 presents an exemplary analog-digital coding chain according to the invention using a noise synthesizer of the type of that of FIG. 1, applied in a radar receiver for example. The useful signal 21, for example a radar reception signal, is combined with the noise signal by means of a combiner 22 before digital conversion by the ADC 23. The noise is thereafter filtered downstream of the ADC.

As described previously, the noise generation, also called "dither" hereinafter, is synthesized initially in digital. In the exemplary application of FIG. 2, the number N of pathways is equal to 4.

A module 1 carries out the generation of white noise on 4 bits, sampled at ⅔ of the desired central frequency Fc of the dither, i.e. for example Fc equal to $F_{smp}/2$. A clock at the frequency FH=⅔ Fc is therefore used by the module 1 to synthesize noise on 4 bits. The module generates in a conventional manner a pseudo random code by means of a shifted shift register looped back on itself and whose initialization value is parametrizable in the mask of the module. A shuffling function can be added to increase the random character of the code thus generated. It is possible to modulate the random signal, that is to say decrease or increase its amplitude, by adjusting an amplitude parameter. This dither function is instantiated twice within the module with different initialization values so as to generate noise sampled at 2×FH, i.e. at ⁴⁄₃ of the central frequency Fc.

A function for shaping and concatenating the various noises is carried out. The multiplexing of two independent noises and of their complemented values makes it possible to maximize the power of the noise around the central frequency Fc, this corresponding to a spectral zone that will be maximized by the analog filtering 4. More precisely, as regards the maximization of the noise in the desired frequency band, one starts from the principle that this noise must be placed outside the useful band, that is to say outside the band utilized by the ADC 23, and this noise is shaped in such a way as to ensure that its contribution in the useful band after sampling remains negligible with respect to the noise of the ADC and above all in relation to the noise of the reception chain, in the case of a radar application for example.

Generally, ideally, the spectrum of the shaped noise is the "spectral complement" of the useful band that one wishes to utilize. By considering that the digital filtering at the output of the ADC 23 is capable of rejecting the shaped noise, the noise injected at the input of the ADC is eliminated at output.

In practice, to carry out a simple digital pre-shaping on one bit, it is possible to utilize the sin(X)/X natural decay for sustained sampling and the spectrum around the frequency where one wishes to maximize the power is shifted by carrying out an interpolation by 2 by inserting complemented samples. The ratio between the sampling frequency $F_{smp}$ of the ADC and the sampling frequency $F_{smpn}$ of the noise makes it possible to place the noise spectrally in an optimum manner with respect to this objective.

For example, Ni being equal to 0 or 1, for a series of samples (N1, N2, N3, N4, ... Nn) regulated at $F_{smp}/2$, one obtains a series of the following form after interpolation: (N1, −N1, N2, −N2, N3, −N3, N4, −N4 ... Nn, −Nn) sampled at $F_{smp}$.

More generally, this shaping may be much more sophisticated and make it possible to digitally shape more complex spectra by relying on digital Sigma-Delta shaping techniques. Raised frequency and the miniaturization of FPGA technologies may make it possible to minimize, or indeed to dispense with, the analog filtering 4 which will be more particularly described hereinafter.

The multiplexer 2 multiplexes the noise coded on 4 bits to generate noise coded on 1 bit sampled at 4×FH, i.e. ⅔ Fc.

As described previously, the signal is thereafter dispatched to the buffer 3 so as to transfer the digitized noise, on one bit, into the analog domain. This transfer is advantageously carried out by a differential transmission interface, for example according to the LVDS standard. This interface can be a differential interface of the FPGA used moreover for the dither or noise generation function. This exhibits the advantage of using an internal resource of the FPGA and does not necessitate a specific conversion circuit.

For example, in the case of using an LVDS differential interface, the output level of 350 mV across the terminals of a resistor of 100 ohms, characteristics specific to this standard, makes it possible to obtain an output power of −8 dBm once the line impedance has been brought down to 50 ohms. This adaptation to 50 ohms is moreover very simple because the LVDS differential interface works in differential on 100 ohms.

The digital noise synthesis being optimized so as to maximize the power around the central frequency employed, for example $F_{smp}/2$, results in a power of the order of −10 dBm at the output of the LVDS interface, that is to say of the buffer 3.

Given that generated noise has a shaping, defined by its passband, carried out by digital synthesis, the analog filtering 4 which follows may be less constrained.

The analog filtering 4 must be dimensioned in such a way as to guarantee the absence of noise residue in the useful band of the signal to be converted by the ADC 23. The differential gap between the useful band and the noise band must therefore be sufficient. Here again, the choice of the central frequency of the noise is optimized and profits from the principles of the sampling which is carried out ultimately by the ADC.

Indeed, the useful band of the signal may not be positioned straddling a multiple of the point ½ $F_{smp}$, $F_{smp}$ being as indicated previously the sampling frequency of the ADC.

In an advantageous embodiment, it is specifically at this frequency ½ $F_{smp}$ that the noise is centered. Thus for a given band, after conversion by the ADC the noise occupies only half its initial band, the sampling principle having aliased the input signals to ½ $F_{smp}$, while having the effectiveness of the total band of the noise.

The bandpass analog filtering is thus added at the output of the differential interface 3 so as to properly decorrelate the useful band from the band of the noise. An amplifier 5 can be added as a function of the full scale of the ADC or if the noise band is relatively narrow.

The filtered and optionally amplified noise is combined with the useful signal by the RF-frequency combiner 22, the combined signal being converted into a digital signal by the ADC. The noise combined with the digitized signal is thereafter filtered by a digital filter 24. The benefit of the shaped noise, that is to say with a narrow and controlled passband, is that it can be easily placed outside the useful band of the signal and therefore filtered in a simple manner. Thus, after coding, the noise elimination can be carried out by a simple digital filter 24 which is generally already present at the output of the ADC.

The invention therefore makes it possible to guarantee complete elimination of the noise ultimately, in contradistinction to the conventional methods of noise synthesis where the noise occupies the whole sampling band. In these conventional methods the digital image is subtracted after conversion to digital and the effectiveness of this suppression is dependent on the quality of the digital representation of the coded noise which is very difficult to obtain. Positioning the central frequency of the noise at $F_{smp}/2$ therefore makes it possible to obtain maximum effectiveness at the level of the correction of the non-linearity defects of the ADC, and of coders in general, while distancing the frequency band of the noise as far away from the useful band as possible.

In addition to the guarantee of complete suppression of the noise, the invention makes it possible to embody a noise generator in a reduced volume, or indeed one which is zero or quasi-zero with respect to existing hardware. In many applications, radar in particular, an FPGA is already present since it is used to interface with the ADC. This available FPGA can contain the function for digitally generating the noise coded on one bit and the LVDS differential interface for passing to the analog domain.

It is not necessary to call upon an external clock since all the synthesis operations can use the resources of clocks of other functions, in particular in radar reception chains. The bandpass analog filter 4 may optionally have to be added if this resource is not available.

The invention advantageously makes it possible to circumvent a digital-analog noise conversion component. The noise signal being coded on one bit, it is advantageously possible to use a differential interface, for example of the LVDS type as was described. Advantageously, without changing the synthesis principle of the invention, it is possible to increase the frequency of the noise in tandem with the frequency evolution of this type of interface.

The invention also presents another advantage in the sense that it does not require any specific processing at acquisition output other than the analog filter 4 which limits the noise signal to the useful band in order to eliminate the noise on output from the coder 23.

In the case of an application to a radar reception chain, the noise generated according to the invention may be in a location of the spectrum far away from the frequency band of the received signals, and this noise is naturally filtered by the radar reception chain, without requiring any additional components or functions.

The invention advantageously makes it possible to obtain a coding chain with very high linearity and very large dynamic range. The frequency of the noise may reach frequencies of the order of 1 GHz.

The invention claimed is:

1. A method of synthesizing analog noise, comprising at least the following steps:
   generating pseudo random noise in a digital domain coded on a number N of bits with a noise generator, sampled at a given frequency FH/N, FH being a frequency;
   multiplexing in a digital domain with a multiplexer binary signals produced by each of the N bits at the sampling frequency FH so as to obtain noise coded on one bit at said sampling frequency FH; and
   transferring the noise thus coded into an analog domain via a differential transmission interface,
   wherein the differential transmission interface is of a LVDS (Low Voltage Differential Signal) type.

2. The method as claimed in claim 1, wherein the step of transferring into the analog domain is followed by a step of analog filtering by a bandpass filter.

3. The method as claimed in claim 2, wherein said noise being able to be combined with a useful signal at an input of an analog-digital converter, a passband of said analog filter is centered on half the sampling frequency of said analog-digital converter, said passband not overlapping a frequency band of said useful signal.

4. The method as claimed claim 1, comprising a step of amplifying the noise in the analog domain.

5. The method as claimed in claim 1, wherein said analog noise being able to be combined with a useful signal at an input of an analog-digital converter, the noise coded on one bit on output from the multiplexing step is centered on a central frequency Fc equal to half the sampling frequency of said analog-digital converter.

6. The method as claimed in claim 1, wherein the number N being equal to 4, said pseudo random noise is sampled at a frequency equal to ⅔ of a central frequency Fc.

7. An analog noise synthesizer, comprising at least the following modules:
   a module for generating pseudo random noise in a digital domain coded on a number N of bits, sampled at a given frequency FH/N, FH being a frequency;
   a multiplexer carrying out in the digital domain a multiplexing of binary signals produced by each of the N bits at a sampling frequency FH so as to obtain noise coded on one bit at said frequency FH; and
   a differential transmission interface for transferring the noise thus coded into an analog domain,
   wherein the differential transmission interface is of a LVDS (Low Voltage Differential Signal) type.

8. The synthesizer as claimed in claim 7, further comprising a bandpass analog filter at an output of the differential transmission interface.

9. The synthesizer as claimed in claim 8, wherein said analog noise being able to be combined with a useful signal at an input of an analog-digital converter, a passband of said filter is centered on half the sampling frequency of said analog-digital converter, said passband not overlapping a frequency band of said useful signal.

10. The synthesizer as claimed in claim 7, comprising an amplification stage at an output of said analog filter.

11. The synthesizer as claimed in claim 7, wherein said analog noise being able to be combined with a useful signal at an input of an analog-digital converter, the noise coded on one bit on output from the multiplexer is centered on a central frequency Fc equal to half the sampling frequency of said analog-digital converter.

12. The synthesizer as claimed in claim 7, wherein the number N being equal to 4, said pseudo random noise is sampled at a frequency equal to ⅔ of a central frequency Fc.

13. The synthesizer as claimed in claim 7, wherein the pseudo random noise generation module and the multiplexer are embodied in an FPGA (Field-Programmable Gate Array), the differential transmission interface being a differential output of said FPGA.

14. An analog-digital coding chain, said chain being able to code a useful signal, comprising at least:
   an analog-digital converter;
   a synthesizer as claimed in claim 7;
   a combiner combining said useful signal and the noise generated by said synthesizer;
   an output of said combiner being linked to an input of said analog-digital converter, so that a combined signal is digitally converted.

15. The coding chain as claimed in claim 14, wherein the combined signal is filtered on output from the analog-digital converter by a digital filter.

16. The coding chain as claimed in claim 14, wherein it is able to be used in a radar reception chain, said useful signal being a radar reception signal.

* * * * *